(12) United States Patent
Kim et al.

(10) Patent No.: US 10,448,502 B2
(45) Date of Patent: Oct. 15, 2019

(54) ELECTRONIC COMPONENT AND BOARD HAVING ELECTRONIC COMPONENT MOUNTED THEREON

(71) Applicant: SAMSUNG ELECTRO-MECHANICS CO., LTD., Suwon-si, Gyeonggi-do (KR)

(72) Inventors: Ho Yoon Kim, Suwon-si (KR); Kyoung Jin Jun, Suwon-si (KR); Min Kyoung Cheon, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 127 days.

(21) Appl. No.: 15/179,513

(22) Filed: Jun. 10, 2016

(65) Prior Publication Data

US 2017/0105283 A1   Apr. 13, 2017

(30) Foreign Application Priority Data

Oct. 12, 2015   (KR) .................. 10-2015-0142210

(51) Int. Cl.
| | |
|---|---|
| H05K 1/02 | (2006.01) |
| H05K 1/11 | (2006.01) |
| H05K 1/18 | (2006.01) |
| H05K 3/34 | (2006.01) |
| H05K 1/14 | (2006.01) |

(Continued)

(52) U.S. Cl.
CPC .......... *H05K 1/0271* (2013.01); *H05K 1/032* (2013.01); *H05K 1/0306* (2013.01); *H05K 1/0346* (2013.01); *H05K 1/0393* (2013.01); *H05K 1/111* (2013.01); *H05K 1/181* (2013.01); *H05K 1/189* (2013.01); *H05K 3/3442* (2013.01); *H05K 1/141* (2013.01); *H05K 3/301* (2013.01); *H05K 2201/0145* (2013.01); *H05K 2201/0154* (2013.01); *H05K 2201/041* (2013.01); *H05K 2201/049* (2013.01); *H05K 2201/2045* (2013.01); *Y02P 70/613* (2015.11)

(58) Field of Classification Search
CPC ............................ H05K 1/0271; H05K 1/141
See application file for complete search history.

(56) References Cited

U.S. PATENT DOCUMENTS

| | | | |
|---|---|---|---|
| 2014/0284089 A1* | 9/2014 | Hattori | ................... H05K 1/141 174/258 |
| 2015/0206661 A1* | 7/2015 | Fujimura | ................. H01G 4/30 361/301.4 |

(Continued)

FOREIGN PATENT DOCUMENTS

| | | |
|---|---|---|
| JP | 2012-033654 A | 2/2012 |
| JP | 2014-229867 A | 12/2014 |
| JP | 2015-135910 A | 7/2015 |

*Primary Examiner* — Nathan Milakovich
(74) *Attorney, Agent, or Firm* — Morgan, Lewis & Bockius LLP

(57) ABSTRACT

An electronic component includes a body including a dielectric material and internal electrodes embedded in the dielectric material; external electrodes connected to the internal electrodes and disposed on the body; a first substrate connected to the external electrodes and disposed on one side of the body; and a second substrate connected to the first substrate and disposed on one side of the first substrate. The first and second substrates have different Young's modulus.

19 Claims, 12 Drawing Sheets

(51) Int. Cl.
  *H05K 3/30*  (2006.01)
  *H05K 1/03*  (2006.01)

(56)  References Cited

U.S. PATENT DOCUMENTS

| | | | |
|---|---|---|---|
| 2016/0133386 A1* | 5/2016 | Park | H01G 4/40 |
| | | | 361/767 |
| 2016/0307700 A1* | 10/2016 | Park | H01G 2/065 |
| 2017/0011854 A1* | 1/2017 | Son | H01G 4/38 |
| 2017/0064811 A1* | 3/2017 | Li | H01G 4/224 |
| 2017/0127520 A1* | 5/2017 | Park | H05K 1/181 |
| 2019/0066918 A1* | 2/2019 | Jeong | H01G 4/12 |

\* cited by examiner

ELECTRONIC COMPONENT AND BOARD HAVING ELECTRONIC COMPONENT MOUNTED THEREON

CROSS-REFERENCE TO RELATED APPLICATION

This application claims the benefit of priority to Korean Patent Application No. 10-2015-0142210, filed on Oct. 12, 2015 with the Korean Intellectual Property Office, the entirety of which is incorporated herein by reference.

BACKGROUND

The present disclosure relates to a small electronic component mounted on a circuit board.

A small electronic component, such as a capacitor, an inductor, a piezoelectric element, a varistor, a thermistor, or the like, generally includes a body formed of a dielectric material, internal electrodes disposed within the body, and external electrodes disposed on a surface or surfaces of the body so as to be connected to the internal electrodes. A multilayer ceramic capacitor (MLCC), among the above-mentioned electronic components, has been widely used as an electronic component in mobile communications devices such as computers, personal digital assistants (PDA), cellular phones, and the like, because it has advantages such as a small size, high capacitance, and ease of mounting.

In general, a multilayer ceramic capacitor is mounted on a mounting pad of the circuit board by soldering. As a result, the multilayer ceramic capacitor is electrically connected to other external circuits. Here, the multilayer ceramic capacitor formed of a ferroelectric material may vibrate due to a piezoelectric phenomenon occurring therein. The vibrations of the multilayer ceramic capacitor may be transferred to the circuit board on which the multilayer ceramic capacitor is mounted, through the solder. As a result, acoustic noise may occur. Such acoustic noise has become a serious problem in some electronic products.

SUMMARY

An aspect of the present disclosure provides an electronic component having a novel structure capable of reducing acoustic noise occurring when the electronic component is mounted on a circuit board.

According to an aspect of the present disclosure, a plurality of substrates having different Young's modulus capable of reducing vibrations occurring in a body of an electronic component may be disposed between the body of the electronic component and a circuit board.

According to an aspect of the present disclosure, an electronic component comprises: a body including a dielectric material and internal electrodes embedded in the dielectric material; external electrodes connected to the internal electrodes and disposed on the body; a first substrate connected to the external electrodes and disposed on one side of the body; and a second substrate connected to the first substrate and disposed on one side of the first substrate. The first and second substrates have different Young's modulus.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
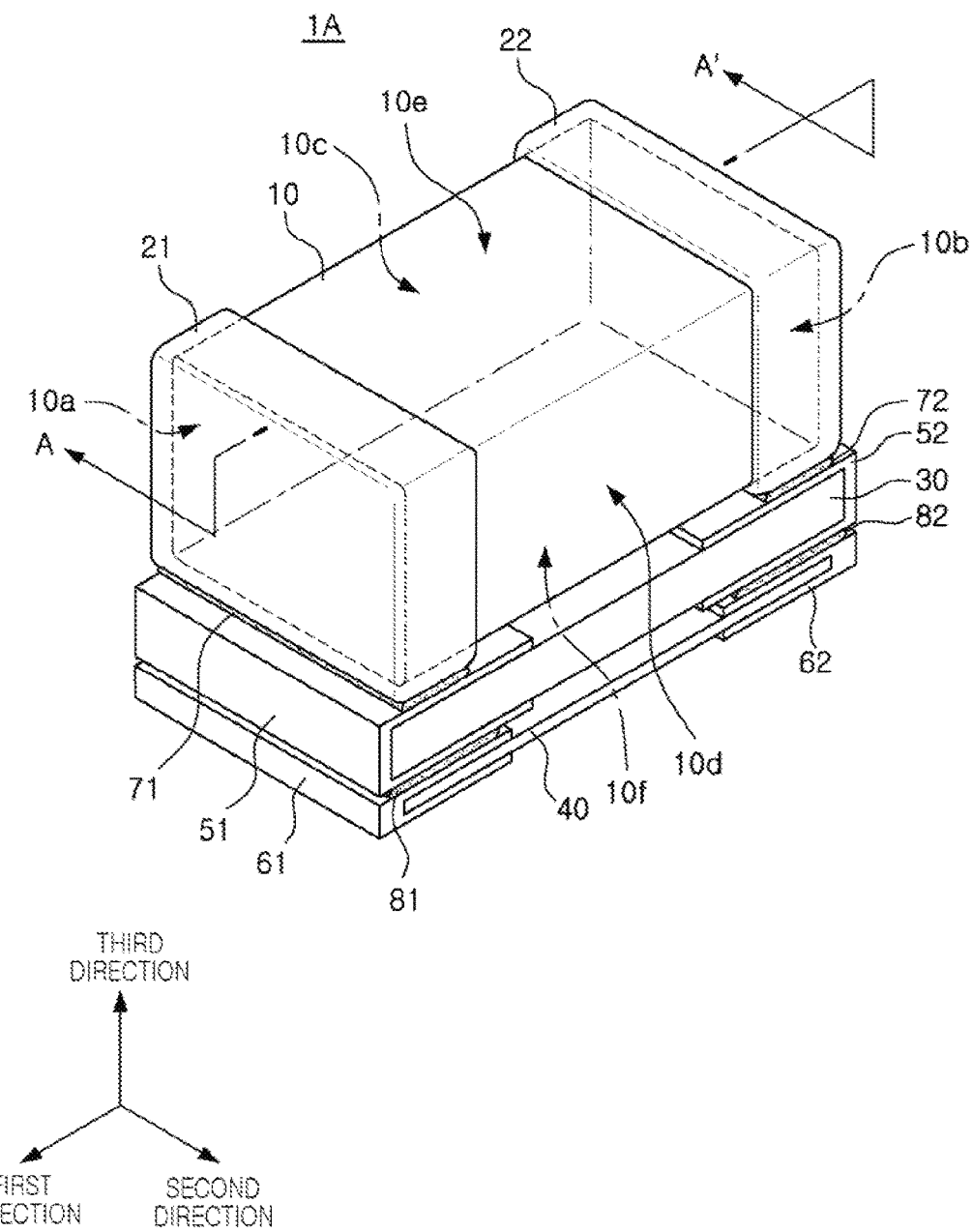
FIG. 1 is a perspective view schematically illustrating an electronic component according to an example.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

FIG. 1 is a perspective view schematically illustrating an electronic component according to an example.

Figure 2:
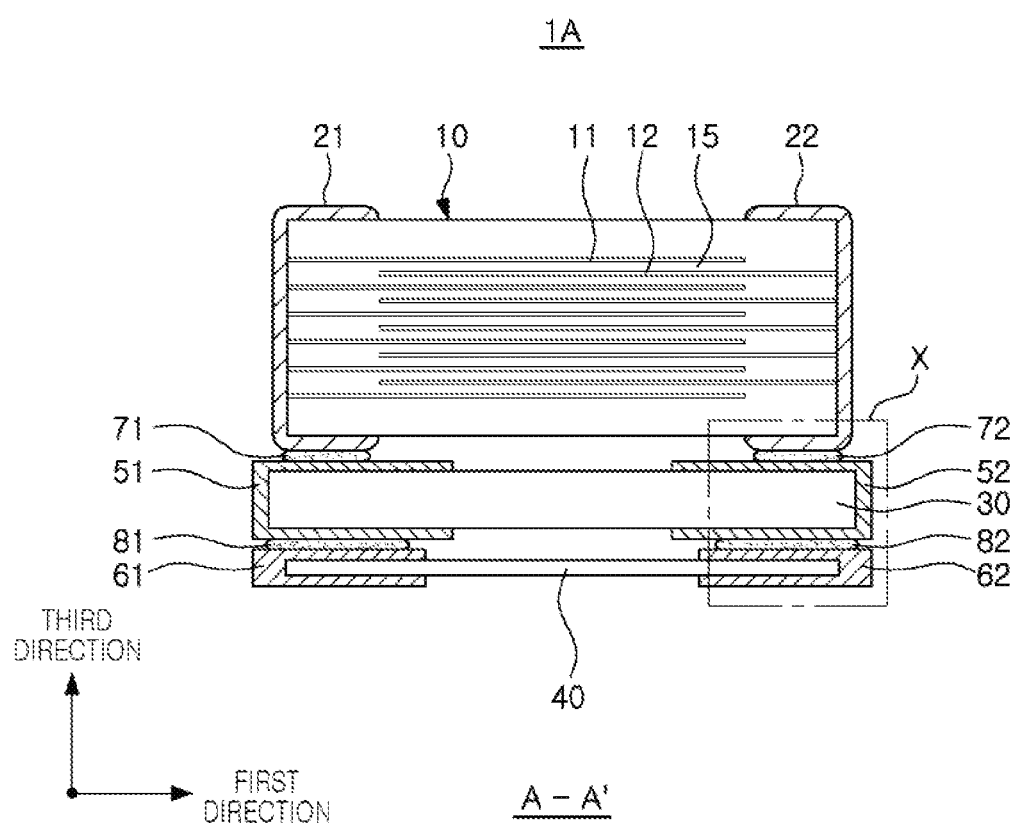
FIG. 2 is a schematic cross-sectional view taken along line A-A' of the electronic component of FIG. 1.

FIG. 2 is a schematic cross-sectional view taken along line A-A' of the electronic component of FIG. 1.

Referring to FIGS. 1 and 2, an electronic component 1A according to the example may include a body 10 including a dielectric material 15 and internal electrodes 11 and 12 embedded in the dielectric material 15, external electrodes 21 and 22 connected to the internal electrodes 11 and 12 and disposed on the body 10, a high Young's modulus substrate 30 connected to the external electrodes 21 and 22 and disposed on one side of the body 10, and a low Young's modulus substrate 40 connected to the high Young's modulus substrate 30 and disposed on one side of the high Young's modulus substrate 30.

A shape of the body 10 is not particularly limited. For example, the body 10 may be formed in a hexahedral shape as illustrated. Here, the body 10 may have a first surface 10a and a second surface 10b opposing each other in a first direction of the body 10, a third surface 10c and a fourth surface 10d opposing each other in a second direction thereof and connecting the first surface 10a and the second surface 10b to each other, and a fifth surface 10e and a sixth surface 10f opposing each other in a third direction thereof and connecting the first surface 10a and the second surface 10b to each other. Here, the body 10 may not have a hexahedral shape having perfectly straight lines, due to sintering shrinkage of the dielectric material in a sintering process, and may have a substantially hexahedral shape.

The body 10 may be formed of the dielectric material 15, for example, a plurality of dielectric layers. The plurality of dielectric layers, which are in a sintered state, may be integrated such that a boundary between adjacent dielectric layers may not be readily confirmed with the naked eye. The dielectric layer may be formed of a ceramic powder having a high dielectric constant, and the ceramic powder may be, for example, a barium titanate ($BaTiO_3$) based power or a strontium titanate ($SrTiO_3$) based power, or the like, but is not limited thereto. Other known ceramic powders may also be used. The body 10 may be formed by a method in which a slurry containing the ceramic powder is applied to and dried on a carrier film to prepare a plurality of ceramic green sheets, conductive paste containing a conductive metal is printed on the respective green sheets to a predetermined thickness to form the internal electrodes 11 and 12, which are then stacked, the green sheets on which the internal electrodes 11 and 12 are not printed are stacked on upper and lower surfaces of a multilayer body, and the stacked green sheets are then sintered.

A plurality of internal electrodes 11 and 12 embedded in the dielectric material 15 may be disposed in the body 10. The plurality of internal electrodes 11 and 12 may be formed by printing the conductive paste containing the conductive metal on the dielectric layer at the predetermined thickness as described above, and may be electrically insulated from each other by the dielectric layers disposed therebetween. The conductive metal may be nickel (Ni), copper (Cu), palladium (Pd), or an alloy thereof, but is not limited thereto.

The plurality of internal electrodes 11 and 12 may include a first internal electrode 11 and a second internal electrode 12, which may be disposed to be alternately exposed through the first surface 10a of the body 10 and the second surface 10b thereof in the first direction thereof while having the dielectric material 15 therebetween, by way of example. The first internal electrode 11 and the second internal electrode 12 may be connected to a first external electrode 21 and a second external electrode 22, respectively. The first internal electrode 11 and the second internal electrode 12 may be overlapped with each other to form capacitance. The first internal electrode 11 and the second internal electrode 12 may be supplied with voltages having opposite polarities through the first external electrode 21 and the second external electrode 22, respectively. However, this layout is only an example, and the layout of the internal electrodes is not necessarily limited thereto. That is, the internal electrodes may also be disposed in other known forms.

The external electrodes 21 and 22 connected to the internal electrodes 11 and 12 may be disposed on an external surface of the body 10. The external electrodes 21 and 22 may be formed by applying conductive paste containing copper (Cu) powder to the surface of the body 10, by way of example. The external electrodes 21 and 22 may also be constituted by a plurality of metal electrode layers, and may also have a structure in which a nickel (Ni) plating layer and a tin (Sn) plating layer are formed on a base electrode having copper (Cu) as a main component, by way of example. In addition, a resin electrode layer may also be formed by applying a resin composition onto the plating layer and then curing the resin composition. The resin composition may include a conductive powder and a base resin, but is not limited thereto, and the base resin may be an epoxy resin, a thermosetting resin.

The external electrodes 21 and 22 may include the first external electrode 21 and the second external electrode 22, which may be disposed to be spaced apart from each other on the body 10, and the first external electrode 21 and the second external electrode 22 may be disposed to cover the first surface 10a of the body 10 and the second surface 10b thereof in the first direction thereof, byway of example. The first external electrode 21 and the second external electrode 22 may be connected to the first internal electrode 11 and the second internal electrode 12, respectively. The first internal electrode 11 and the second internal electrode 12 may be provided with voltages having opposite polarities through the first external electrode 21 and the second external electrode 22, respectively. However, this layout is only an example, and the layout of the external electrodes 21 and 22 is not necessarily limited thereto. That is, the external electrodes may also be disposed in other known forms.

The high Young's modulus substrate 30, which is to primarily suppress vibrations of the body, may be formed of a material having high Young's modulus, for example, a ceramic material. Since the material having high Young's modulus has superior rigidity, it may effectively suppress the vibrations of the body 10. Young's modulus of the high Young's modulus substrate 30 may be about 200 GPa to 400 GPa, and the vibrations of the body 10 may be effectively suppressed within this range. As the ceramic material, for example, alumina may be used, but the ceramic material is not limited thereto. Any material may be used without being particularly limited, as long as the material has a high Young's modulus.

The low Young's modulus substrate 40, provided to secondarily absorb vibrations transferred from the high Young's modulus substrate 30, may be formed of a material having a low Young's modulus, for example, a flexible material. Since the material having a low Young's modulus has a superior vibration absorption effect, it may significantly reduce the vibrations of the body 10 transferred to the circuit board 100 after the electronic component is mounted. A Young's modulus of the low Young's modulus substrate 30 may be about 3 GPa to 120 GPa, and the vibrations of the body 10 may be effectively absorbed within this range. As the flexible material, for example, materials used for a flexible printed circuit board (FPCB), for example, polyimide, polyethylenenaphthalate, and the like may be used, but the flexible material is not limited thereto. Any material may be used without being particularly limited, as long as the material has a low Young's modulus.

In a case in which only the high Young's modulus substrate 30 is disposed between the body 10 and the circuit board 100, since the high Young's modulus substrate 30 absorbs small vibrations, a displacement of the body 10 may be transferred to the circuit board 100 intact, thereby resulting in an insignificant acoustic noise reduction effect. Conversely, in a case in which only the low Young's modulus substrate 40 is used, since the low Young's modulus substrate 40 acts as a medium that transfers waves well, the acoustic noise reduction effect may also be insignificant. Therefore, a sufficient acoustic noise reduction effect may be achieved only if at least the high Young's modulus substrate 30 and the low Young's modulus substrate 40 are disposed together between the body 10 and the circuit board 100.

Connection electrodes 51 and 52 connected to the external electrodes 21 and 22 through bonding materials 71 and 72 may be disposed on the high Young's modulus substrate 30. As the bonding materials 71 and 72, for example, a solder such as a tin (Sn)-antimony (Sb) alloy, a tin (Sn)-silver (Ag)-copper (Cu) alloy, or the like, or a conductive adhesive may be used. The connection electrodes 51 and 52 may be formed by applying conductive paste to the high Young's modulus substrate 30, by way of example. Alternatively, the connection electrodes 51 and 52 may also be formed by a method in which a conductive material is plated on the high Young's modulus substrate 30. As the plating, any one of an electroplating and an electroless plating method may be used. The connection electrodes 51 and 52 may contain copper (Cu), but are not limited thereto. Any material may be used as long as the material is a conductive material.

The connection electrodes 51 and 52 may include a first connection electrode 51 and a second connection electrode 52, which are disposed on the high Young's modulus substrate 30 to be spaced apart from each other, and the first connection electrode 51 and the second connection electrode 52 may each be disposed to surround both end portions of the high Young's modulus substrate 30 in a first direction thereof, by way of example. The bonding materials 71 and 72 may include a first bonding material 71 and a second bonding material 72 connected to the first connection electrode 51 and the second connection electrode 52, respectively. The first connection electrode 51 may be connected to the first external electrode 21 through the first bonding material 71, and the second connection electrode 52 may be connected to the second external electrode 22 through the second bonding material 72. However, this layout is only an example, and the layout of the connection electrodes 51 and 52 is not necessarily limited thereto. That is, the layout of the connection electrodes 51 and 52 may be appropriately modified according to the layout of the external electrodes 21 and 22, and in some cases, the connection electrodes 51 and 52 may also have a layout in which they are embedded in the high Young's modulus substrate 30.

Connection electrodes 61 and 62 connected to the connection electrodes 51 and 52 through bonding materials 81 and 82 may be disposed on the low Young's modulus substrate 40. As the bonding materials 81 and 82, for example, a solder such as a tin (Sn)-antimony (Sb) alloy, a tin (Sn)-silver (Ag)-copper (Cu) alloy, or the like, or a conductive adhesive may be used. The connection electrodes 61 and 62 may be formed by applying conductive paste onto the low Young's modulus substrate 40, by way of example. Alternatively, the connection electrodes 61 and 62 may also be formed by a method in which a conductive material is plated on the low Young's modulus substrate 40. As the plating, any one of an electroplating and an electroless plating method may be used. The connection electrodes 61 and 62 may contain copper (Cu), but are not limited thereto. Any material may be used as long as the material is a conductive material.

The connection electrodes 61 and 62 may include a third connection electrode 61 and a fourth connection electrode 62, which are disposed on the low Young's modulus substrate 40 to be spaced apart from each other, and the third connection electrode 61 and the fourth connection electrode 62 may be each disposed to surround both end portions of the low Young's modulus substrate 40 in a first direction thereof, by way of example. The bonding materials 81 and 82 may include a third bonding material 81 and a fourth bonding material 82 connected to the third connection electrode 61 and the fourth connection electrode 62, respectively. The third connection electrode 61 may be connected to the first connection electrode 51 through the third bonding material 81, and the fourth connection electrode 62 may be connected to the second connection electrode 52 through the fourth bonding material 82. However, this layout is only an example, and the layout of the connection electrodes 61 and 62 is not necessarily limited thereto. That is, the layout of the connection electrodes 61 and 62 may be appropriately modified according to the layout of the connection electrodes 51 and 52, and in some cases, the connection electrodes 61 and 62 may also have a layout in which they are embedded in the low Young' modulus substrate 40.

Figure 3A:
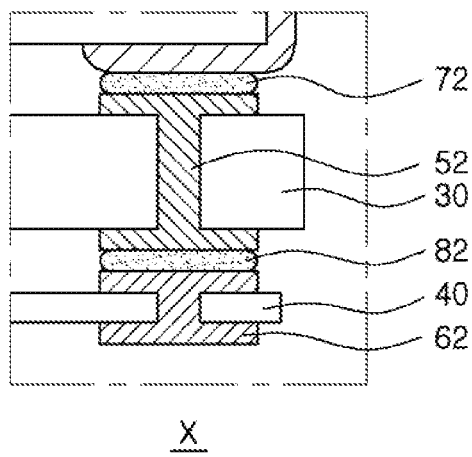
FIGS. 3A and 3B are schematic enlarged views of a region X illustrating modified examples of the electronic component of FIG. 2.
Figure 3B:
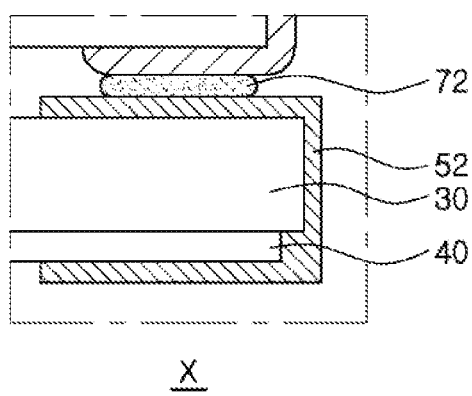

FIGS. 3A and 3B are schematic enlarged views of a region X illustrating modified examples of the electronic component of FIG. 2.

Referring to FIG. 3A, the connection electrodes 51 and 52 may penetrate through the high Young's modulus substrate 30. For example, the connection electrodes 51 and 52 may include the first connection electrode 51 and the second connection electrode 52, which penetrate through the high Young's modulus substrate 30 and are disposed to be spaced apart from each other. In addition, the connection electrodes 61 and 62 may penetrate through the low Young's modulus substrate 40. For example, the connection electrodes 61 and 62 may include the third connection electrode 61 and the fourth connection electrode 62, which penetrate through the low Young's modulus substrate 40 and disposed to be spaced apart from each other.

Referring to FIG. 3B, the high Young's modulus substrate 30 and the low Young's modulus substrate 40 may be in contact with each other. Here, the connection electrodes 51 and 52 connected to the external electrodes 21 and 22 through the bonding materials 71 and 72 may be disposed on the high Young's modulus substrate 30 and the low Young's modulus substrate 40. For example, the connection electrodes 51 and 52 may include the first connection electrode 51 and the second connection electrode 52, which are disposed on the high Young's modulus substrate 30 and the low Young's modulus substrate 40 to be spaced apart from each other, and the first connection electrode 51 and the second connection electrode 52 may be each disposed to surround both end portions of the high Young's modulus substrate 30 and the low Young's modulus substrate 40 in a first direction thereof, byway of example. However, as illustrated in FIG. 2, the case in which the high Young's modulus substrate 30 and the low Young's modulus substrate 40 are spaced apart from each other may be more advantageous from a vantage point of the mechanism described above.

Figure 4:
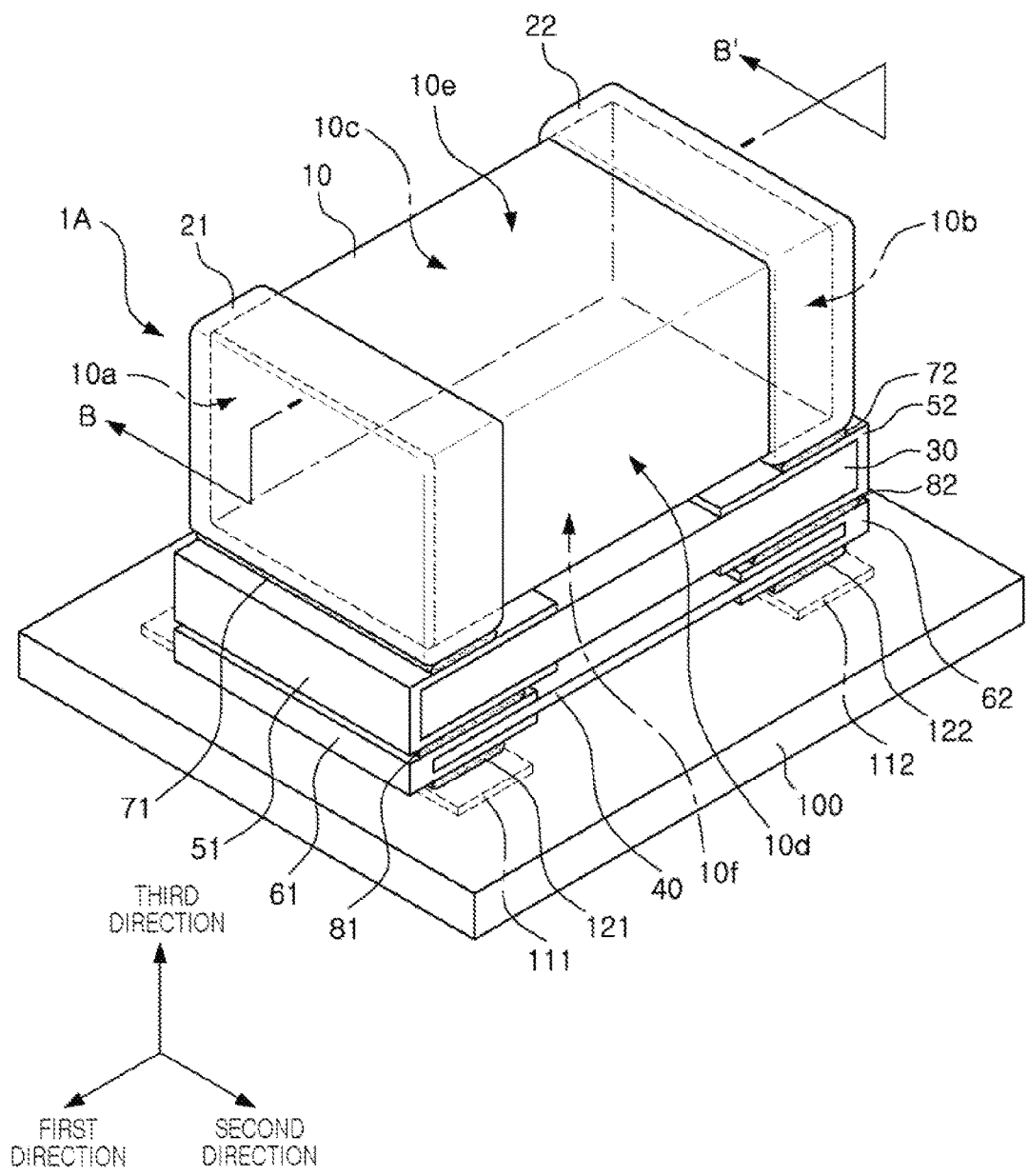
FIG. 4 is a perspective view schematically illustrating a board on which an electronic component is mounted, according to an example.

FIG. 4 is a perspective view schematically illustrating a board on which an electronic component is mounted, according to the present example.

Figure 5:
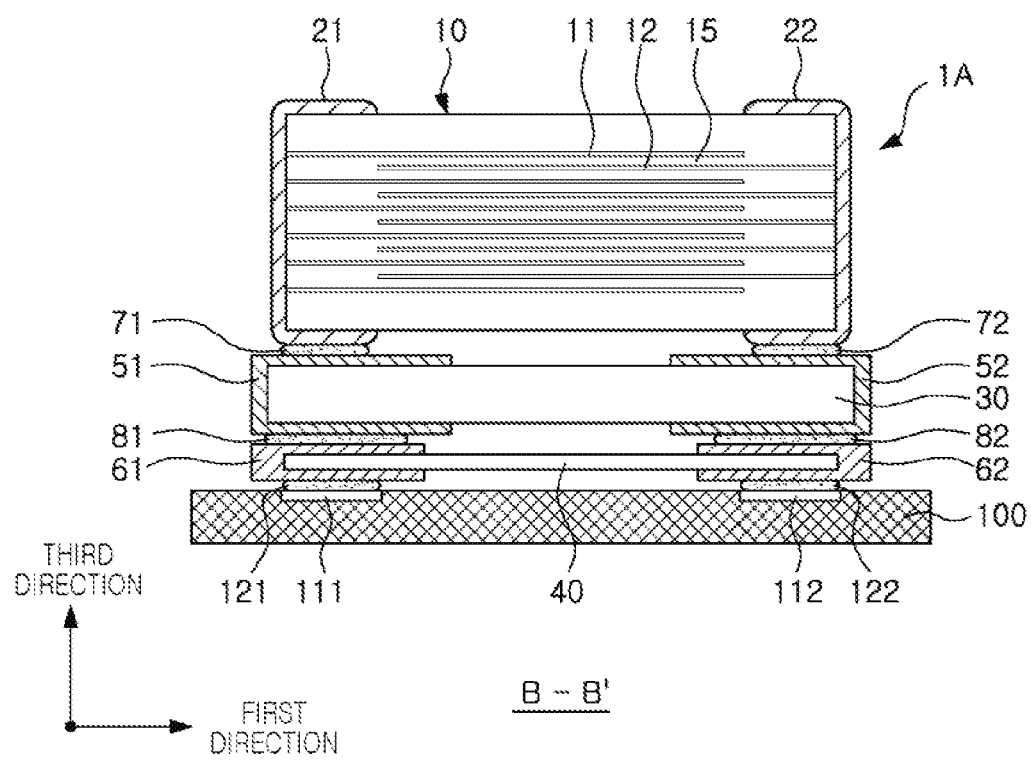
FIG. 5 is a schematic cross-sectional view taken along line B-B' of the board on which the electronic component is mounted, of FIG. 4.

FIG. 5 is a schematic cross-sectional view taken along line B-B' of the board on which the electronic component is mounted, of FIG. 4.

Referring to FIGS. 4 and 5, a board on which an electronic component 1A is mounted according to one example may include the circuit board 100 having electrode pads 111 and 112, and the electrode component 1A mounted on the circuit board 100 through the electrode pads 111 and 112 of the circuit board 100.

The board on which the electrode component 1A is mounted according to the present example may have the high Young's modulus substrate 30 and the low Young's modulus substrate 40 disposed between the body 10 of the electronic component 1A and the circuit board 100. Specifically, the high Young's modulus substrate 30 may be disposed between the body 10 and the low Young's modulus substrate 40, and the low Young's modulus substrate 40 may be disposed between the high Young's modulus substrate 30 and the circuit board 100.

The connection electrodes 61 and 62 may be connected to the electrode pads 111 and 112 of the circuit board 100 through bonding materials 121 and 122. The electrode pads 111 and 112 of the circuit board 100 may contain a conductive material, for example, copper (Cu), or the like. As the bonding materials 121 and 122, for example, a solder such as a tin (Sn)-antimony (Sb) alloy, a tin (Sn)-silver (Ag)-copper (Cu) alloy, or the like, or a conductive adhesive may be used.

The electrode pads 111 and 112 of the circuit board 100 may include a first electrode pad 111 and a second electrode pad 112 disposed on or in the circuit board to be spaced apart from each other. The bonding materials 121 and 122 may include a fifth bonding material 121 connecting the first electrode pad 111 and the third connection electrode 61 to each other, and a sixth bonding material 122 connecting the second electrode pad 112 and the fourth connection electrode 62 to each other. However, this layout is only an example, and the layout of the electrode pads 111 and 112 is not necessarily limited thereto. That is, the layout of the electrode pads 111 and 112 may be appropriately modified according to the layout of the connection electrodes 61 and 62.

The circuit board 100 may be, for example, a main board of an electrode product, an interposer board of a package, or the like, but is not limited thereto. In addition to this, the circuit board 100 may be any of various kinds of circuit boards on which the electronic component may be mounted. A description of a detailed configuration of the circuit board 100 will be omitted.

Figure 6:
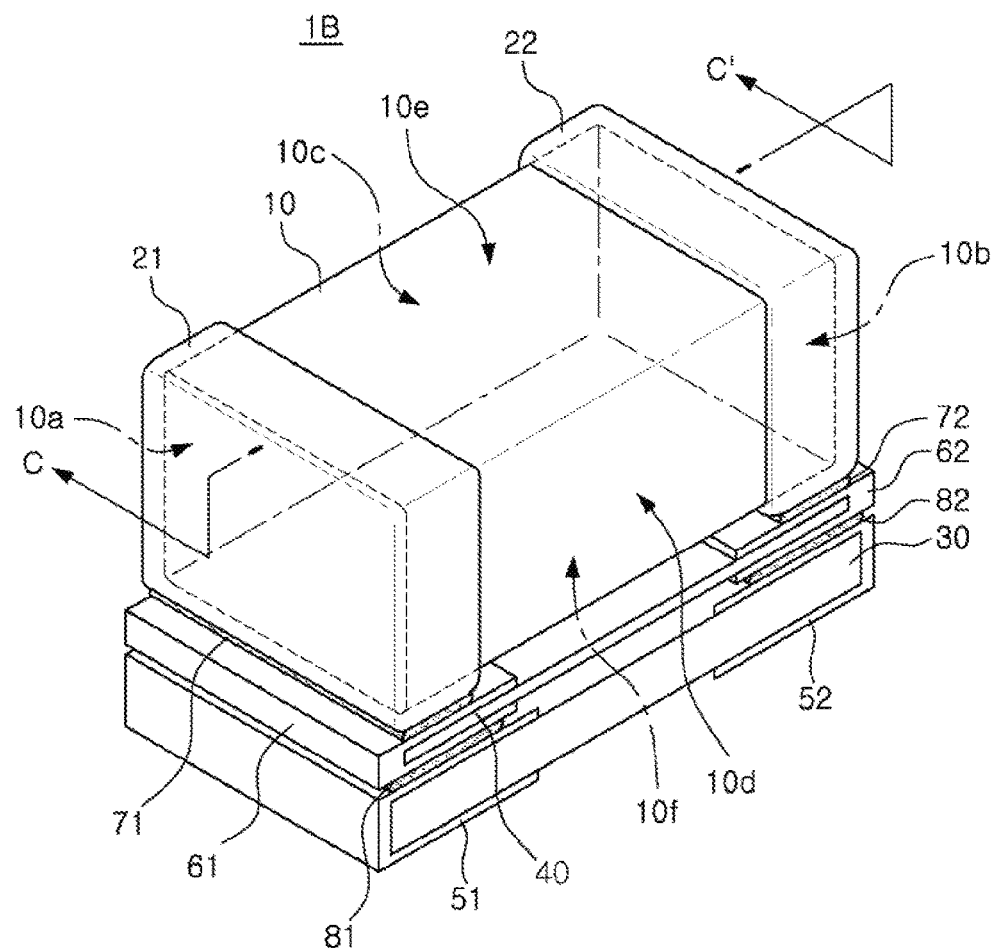
FIG. 6 is a perspective view schematically illustrating an electronic component according to another example.
Figure 6:
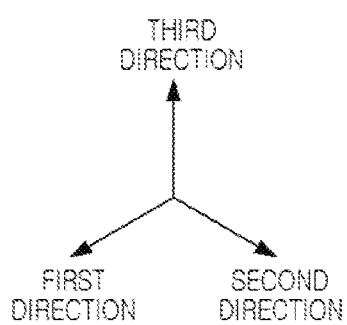

FIG. 6 is a perspective view schematically illustrating an electronic component according to another example.

Figure 7:
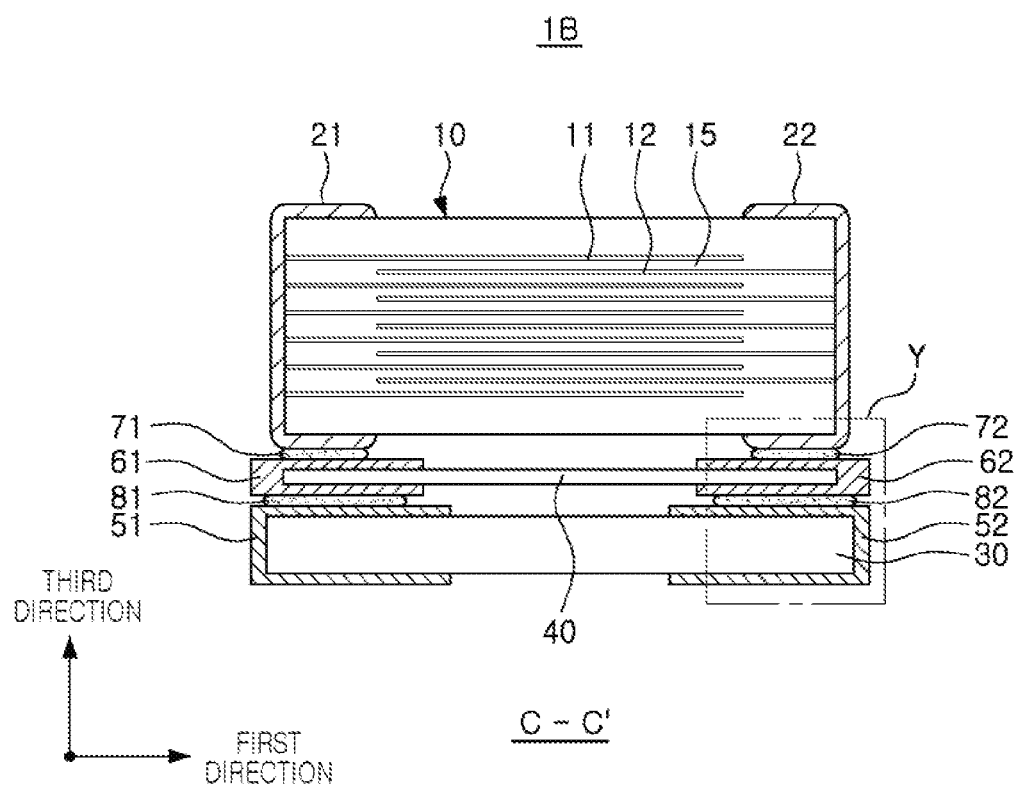
FIG. 7 is a schematic cross-sectional view taken along line C-C' of the electronic component of FIG. 6.

FIG. 7 is a schematic cross-sectional view taken along line C-C' of the electronic component of FIG. 6.

Figure 8A:
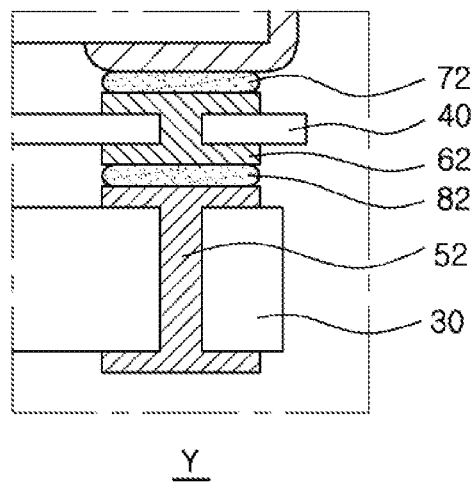
FIGS. 8A and 8B are schematic enlarged views of a region Y illustrating modified examples of the electronic component of FIG. 7.
Figure 8B:
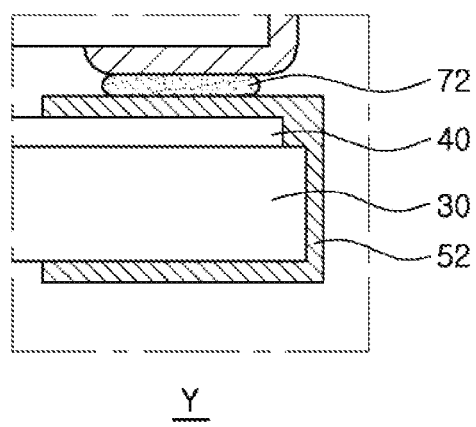

FIGS. 8A and 8B are schematic enlarged views of a region Y illustrating modified examples of the electronic component of FIG. 7.

Referring to FIGS. 6 through 8B, an electronic component 1B according to this modified example may include a body 10 including a dielectric material 15 and internal electrodes 11 and 12 embedded in the dielectric material 15, external electrodes 21 and 22 connected to the internal electrodes 11 and 12 and disposed on the body 10, a low Young's modulus substrate 40 connected to the external electrodes 21 and 22 and disposed on one side of the body 10, and a high Young's modulus substrate 30 connected to the low Young's modulus substrate 40 and disposed on one side of the low Young's modulus substrate 40.

That is, in the board on which the electronic component 1B is mounted according to another example, unlike the board on which the electronic component 1A is mounted according to the previous example, the low Young's modulus substrate 40 may be disposed to be adjacent to the body 10, and the high Young's modulus substrate 30 may be disposed to be adjacent to the circuit board 100. Since other configurations are the same as or similar to those described above, a detailed description thereof will be omitted.

The low Young's modulus substrate 40, which serves to primarily convert a displacement of the body 10 into a wave form, may be formed of the material having low Young's modulus, for example, a flexible material, as described above. Since the material having low Young's modulus is likely to be modified, it may effectively convert the displacement of the body 10 into the wave form. Young's modulus of the low Young's modulus substrate 40 may be about 3 GPa to 120 GPa as described above, and the displacement of the body 10 may be effectively converted into the wave form in this range. As the flexible material, for example, materials used for a flexible printed circuit board (FPCB), for example, polyimide, polyethylenenaphthalate, and the like as described above may be used, but the flexible material is not limited thereto. Any material may be used without being particularly limited, as long as the material has a low Young's modulus.

The high Young's modulus substrate 30, which serves to secondarily suppress the wave form transferred from the low Young's modulus substrate 40, may be formed of a material having high Young's modulus, for example, a ceramic material. Since the material having high Young's modulus has superior rigidity, it may effectively suppress the waves. Young's modulus of the high Young's modulus substrate 30 may be about 200 GPa to 400 GPa as described above, and the waves may be effectively suppressed in this range. As the ceramic material, for example, alumina may be used as described above, but the ceramic material is not limited thereto. Any material may be used without being particularly limited, as long as the material has a high Young's modulus.

As described above, in a case in which only the high Young's modulus substrate 30 is disposed between the body 10 and the circuit board 100, since the high Young's modulus substrate 30 absorbs small vibration, the displacement of the body 10 may be transferred to the circuit board 100 intact, thereby resulting in an insignificant acoustic noise reduction effect. Conversely, in a case in which only the low Young's modulus substrate 40 is used, since the low Young's modulus substrate 40 acts as only a medium that transfers waves well, the acoustic noise reduction effect may also be insignificant. Therefore, as described above, a sufficient acoustic noise reduction effect may be achieved only if at least the high Young's modulus substrate 30 and the low Young's modulus substrate 40 are disposed together between the body 10 and the circuit board 100.

Figure 9:
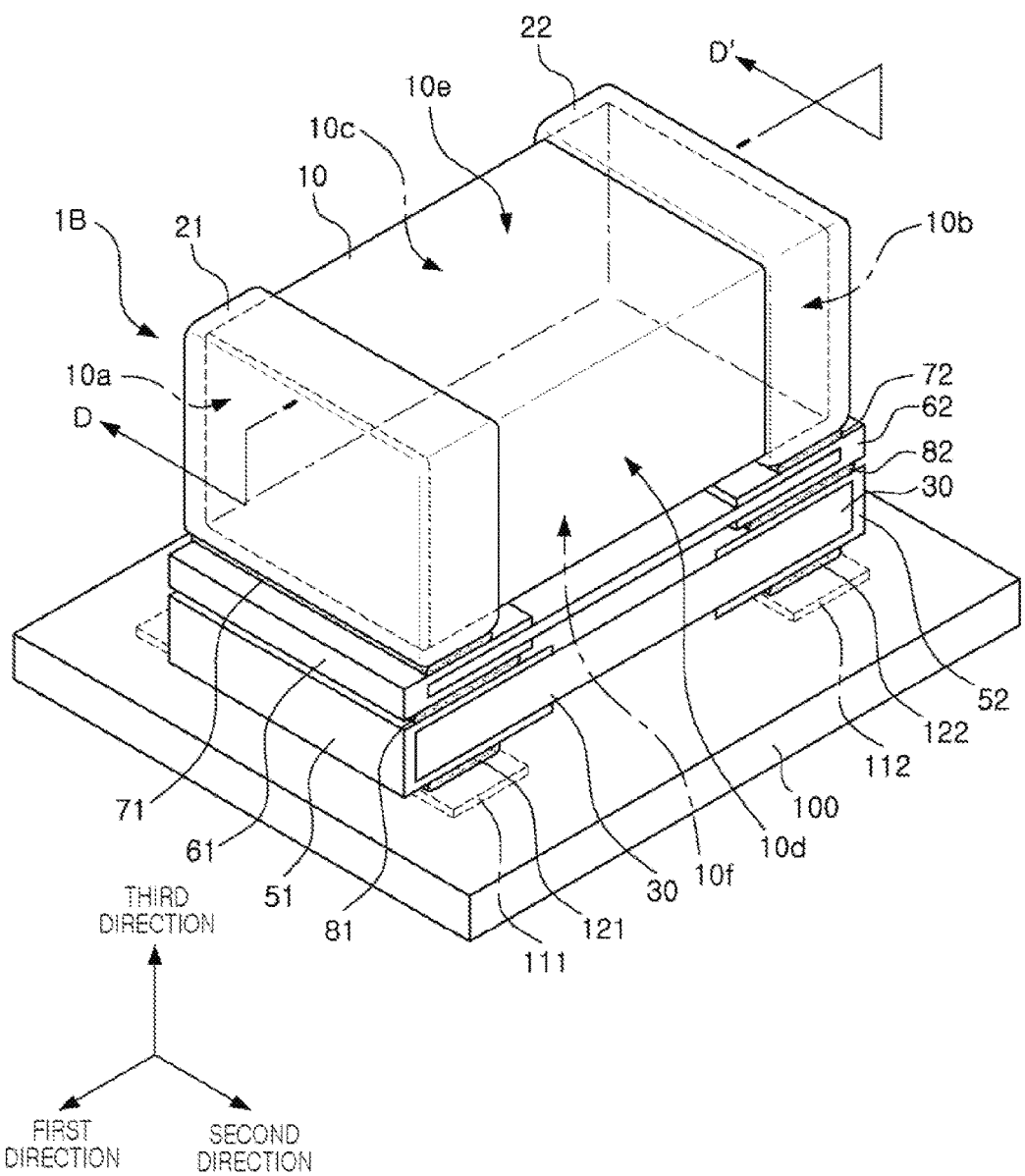
FIG. 9 is a perspective view schematically illustrating a board on which an electronic component is mounted, according to another example.

FIG. 9 is a perspective view schematically illustrating a board on which an electronic component is mounted, according to another example.

Figure 10:
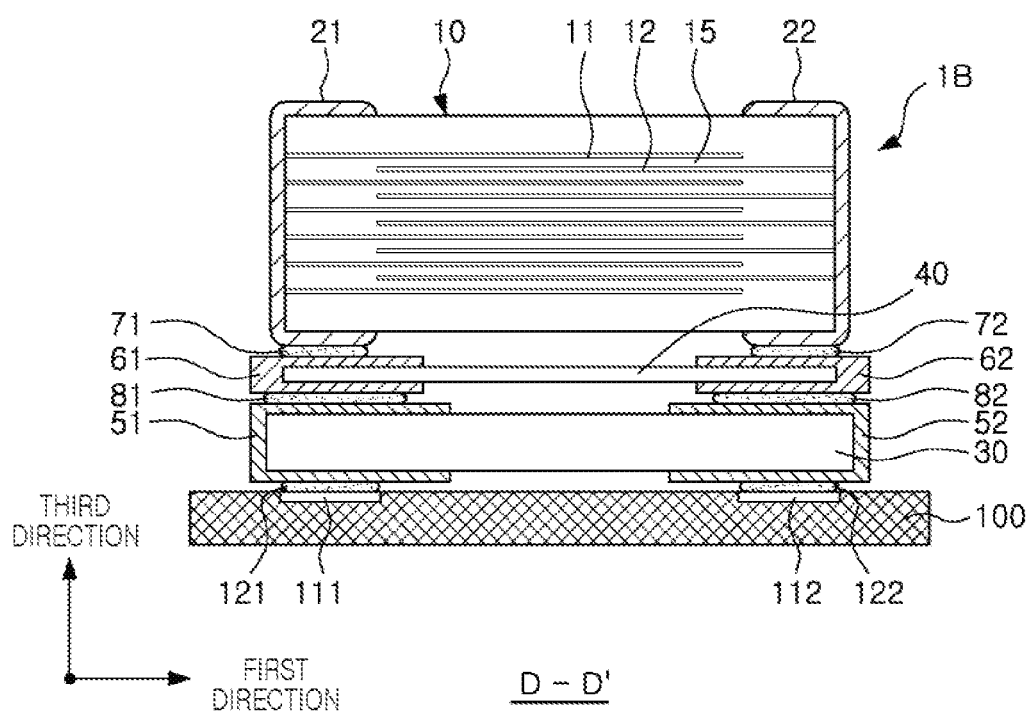
FIG. 10 is a schematic cross-sectional view taken along line D-D' of the board on which the electronic component is mounted, of FIG. 9.

FIG. 10 is a schematic cross-sectional view taken along line D-D' of the board on which the electronic component is mounted, of FIG. 9.

Referring to FIGS. 9 and 10, a board on which an electronic component 1B is mounted according to another example may include the circuit board 100 having electrode pads 111 and 112, and the electrode component 1B mounted on the circuit board 100 through the electrode pads 111 and 112 of the circuit board 100.

The board on which the electrode component 1B is mounted according to this modified example may also have the high Young's modulus substrate 30 and the low Young's modulus substrate 40 disposed between the body 10 of the electronic component 1B and the circuit board 100. However, the low Young's modulus substrate 40 may be disposed between the body 10 and the high Young's modulus substrate 30, and the high Young's modulus substrate 30 may be disposed between the low Young's modulus substrate 40 and the circuit board 100.

That is, in the board on which the electronic component 1B is mounted according to this modified example, unlike the board on which the electronic component 1A is mounted according to the previous example, the low Young's modulus substrate 40 may be disposed to be adjacent to the body 10, and the high Young's modulus substrate 30 may be disposed to be adjacent to the circuit board 100. Since other configurations are the same as those described above, a detailed description thereof will be omitted.

Figure 11A:
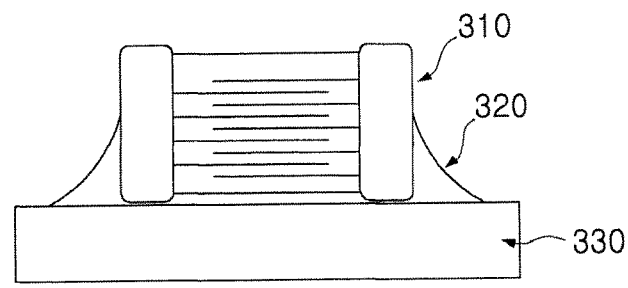
FIGS. 11A through 11C schematically illustrate an acoustic noise occurrence mechanism of the board on which the electronic component is mounted.
Figure 11B:
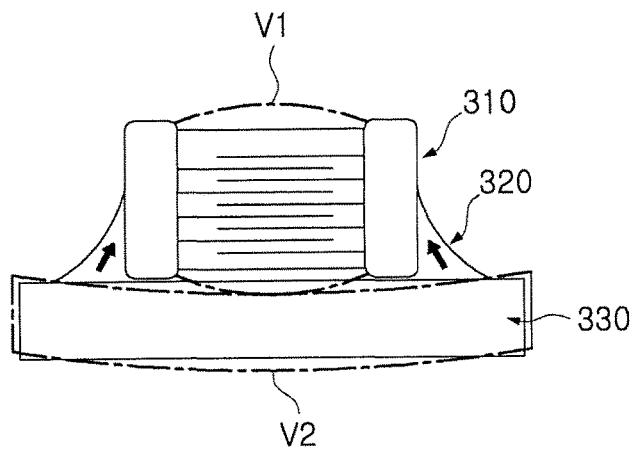
Figure 11C:
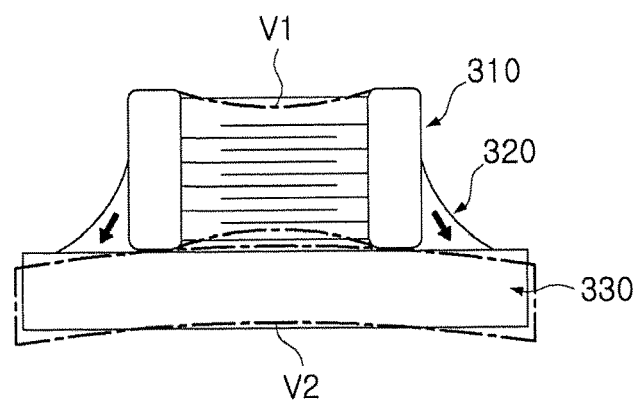

FIGS. 11A through 11C schematically illustrate an acoustic noise occurrence mechanism of the board on which the electronic component is mounted.

Referring to FIGS. 11A through 11C, vibration V1 of an electronic component 310 may have a form illustrated in FIG. 11B or FIG. 11C, and a bonding material 320 may serve as a medium transferring vibrations V1 of the electronic component 310 to a circuit board 330. Therefore, vibrations V1 of the electronic component 310 are transferred to the circuit board 330, such that noise by vibration V2 of the circuit board 330, that is, acoustic noise may occur.

Figure 12:
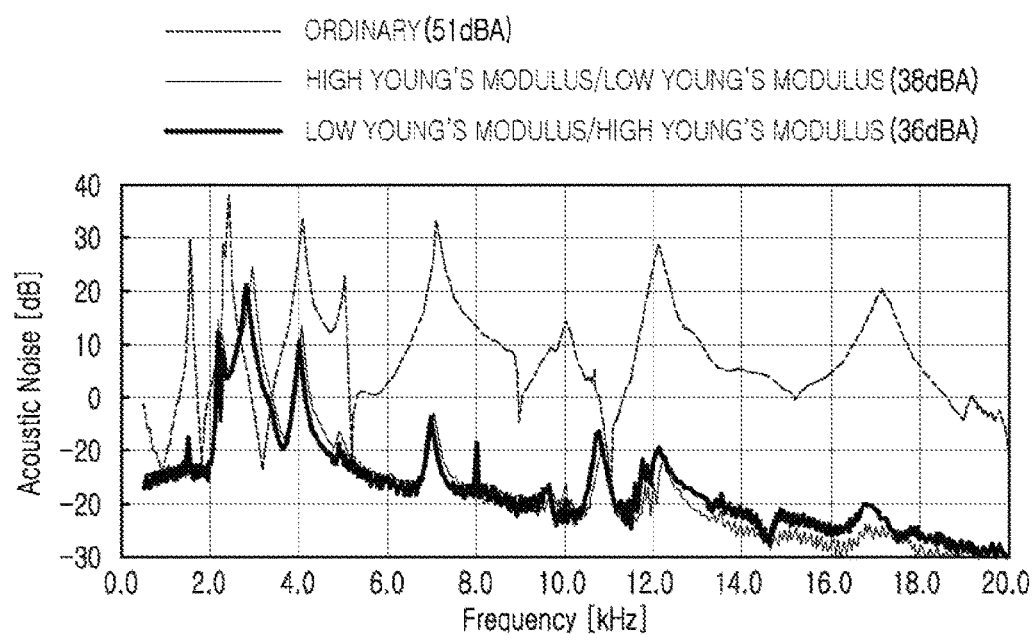
FIG. 12 illustrates an acoustic noise reduction effect of the electronic component according to the present disclosure.

FIG. 12 illustrates an acoustic noise reduction effect of the electronic component according to the present disclosure.

Referring to FIG. 12, it may be appreciated that the acoustic noise reduction effect is surprisingly excellent in a case in which the electronic component is mounted on the circuit board while having the high Young's modulus substrate and the low Young's modulus substrate therebetween as in the present disclosure, as compared to a case in which the electronic component is mounted on the circuit board by only the soldering without disposing the high Young's modulus substrate and the low Young's modulus substrate as illustrated in FIGS. 11A through 11C. Particularly, the present disclosure shows a large effect in reducing the acoustic noise in a high frequency band of 5 MHz or more.

A body of a sample used for evaluating the acoustic noise was manufactured as follows. First, a slurry containing a powder such as a barium titanate ($BaTiO_3$) powder, or the like, was applied and dried onto a carrier film to prepare a plurality of ceramic green sheets, thereby forming a dielectric layer. Next, internal electrodes were formed on the green sheets using conductive paste for a nickel internal electrode by a screen printing method and were then stacked, and a ceramic multilayer body was manufactured. An isostatic pressing for the ceramic multilayer body was performed at a pressure of 1000 kgf/cm$^2$ at a temperature of 85° C. The ceramic multilayer body completed in the pressing process was cut into portions corresponding to individual chips, and the cut chip was maintained at a temperature of 230° C. for 60 hours in air atmosphere and subjected to a debinding treatment. Then, the ceramic multilayer body was sintered in reduction atmosphere having oxygen partial pressure of $10^{-11}$ atm to $10^{-10}$ atm lower than oxygen partial pressure in a state in which Ni/NiO are balanced so that the internal electrodes are not oxidized at a temperature of 1200° C.

In addition, as the high Young's modulus substrate of the sample used for evaluating the acoustic noise, alumina having a plate shape having Young's modulus of about 300 GPa and a thickness of about 0.3 mm was used, and as the low Young's modulus substrate, a flexible printed circuit board (FPCB) having Young's modulus of about 50 GPa and a thickness of about 0.2 mm was used. In addition, mechanical and electrical connections were performed by soldering.

In addition, the respective components of the sample used for evaluating the acoustic noise were disposed in the forms illustrated in FIGS. 3, 7, and 9, respectively.

Meanwhile, the acoustic noise was measured in an anechoic room in which a pulse wave of 3 Vpp is applied to a DC voltage of 12.5 V.

In the present disclosure, the word "connected" is a concept including a case in which any component is indirectly connected to another component by an adhesive layer, or the like, as well as a case in which any component is directly connected to another component. In addition, the phrase "electrically connected" is a concept including both of a case in which any component is physically connected to another component and a case in which any component is not physically connected to another component. In addition, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

The term 'example' used in the present disclosure does not necessarily mean the same example, but is provided in order to emphasize and describe different unique features. However, the above-described examples may be implemented to be combined with features of other examples. For example, even though particulars described in a specific example are not described in another example, it may be understood as a description related to another example unless described otherwise.

Terms used in the present disclosure are used only in order to describe examples rather than limiting the scope of the present disclosure. Here, singular forms include plural forms unless interpreted otherwise in context.

As set forth above, according to the exemplary embodiments in the present disclosure, the electronic component having the new structure capable of reducing the acoustic noise occurring when the electronic component is mounted on a circuit board may be provided.

While exemplary embodiments have been shown and described above, it will be apparent to those skilled in the art that modifications and variations could be made without departing from the scope of the present invention as defined by the appended claims.

What is claimed is:

1. An electronic component comprising:
a body including a dielectric material and internal electrodes embedded in the dielectric material;
first and second external electrodes respectively connected to the internal electrodes and disposed on the body;
a first substrate connected to the first and second external electrodes and disposed on one side of the body;
a second substrate connected to the first substrate and disposed on one side of the first substrate; and
a first connection electrode disposed on the first substrate and connected to the first external electrode; and
a second connection electrode disposed on the first substrate and connected to the second external electrode,
wherein the first and second substrates have different Young's modulus,
the body, the first substrate, and the second substrate are disposed sequentially,
an entirety of the first substrate is disposed between the second substrate and the body,
an entirety of the second substrate is disposed on a side of the first substrate opposing a side of the first substrate facing the body, and
wherein the second substrate includes a first surface facing the first substrate and a second surface opposing the first surface, third and fourth connection electrodes being disposed on or exposed from the second surface and electrically connected to the first and second external electrodes, respectively.

2. The electronic component of claim 1, wherein the first substrate has a higher Young's modulus than that of the second substrate.

3. The electronic component of claim 2, wherein the first substrate suppresses vibrations of the body, and
the second substrate absorbs vibrations transferred from the first substrate.

4. The electronic component of claim 1, wherein the first substrate has a lower Young's modulus than that of the second substrate.

5. The electronic component of claim 4, wherein the first substrate converts a displacement of the body into a wave form, and
the second substrate suppresses waves transferred from the first substrate.

6. The electronic component of claim 1, wherein one of the first and second substrates has a Young's modulus of 200 GPa to 400 GPa, and
the other of the first and second substrates has a Young's modulus of 3 GPa to 120 GPa.

7. The electronic component of claim 1, wherein one of the first and second substrates contains a ceramic material, and
the other of the first and second substrates contains a flexible material.

8. The electronic component of claim 7, wherein the ceramic material is silica.

9. The electronic component of claim 7, wherein the flexible material is polyimide or polyethylenenaphthalate.

10. The electronic component of claim 1, wherein
the first and second external electrodes are disposed on the body to be spaced apart from each other.

11. The electronic component of claim 10, wherein the body includes a plurality of dielectric layers and a plurality of internal electrodes, and
the plurality of internal electrodes include first and second internal electrodes spaced apart from each other with at least one among the plurality of dielectric layers interposed therebetween, and the first and second internal electrodes are connected to the first and second external electrodes, respectively.

12. The electronic component of claim 10, further comprising:
wherein the first and second connection electrodes are spaced apart from each other.

13. The electronic component of claim 12,
wherein the third connection electrode is connected to the first connection electrode,
wherein the fourth connection electrode is connected to the second connection electrode, and
wherein the third and fourth connection electrodes are disposed on the second substrate to be spaced apart from each other.

14. The electronic component of claim 10,
wherein the first and second connection electrodes penetrate through the first substrate, and are disposed to be spaced apart from each other.

15. The electronic component of claim 14,
wherein the third connection electrode is connected to the first connection electrode;
wherein the fourth connection electrode is connected to the second connection electrode, and
wherein the third and fourth connection electrodes penetrate through the second substrate and are disposed to be spaced apart from each other.

16. The electronic component of claim 10,
wherein the first and second substrates are in contact with each other, and the first and second connection electrodes are disposed on the first and second substrates to be spaced apart from each other.

17. The electronic component of claim 12, further comprising a conductive adhesive.

18. A board on which the electronic component of claim 1 is mounted, the board comprising:
    a circuit board having first and second electrode pads; and
    the electronic component mounted on the circuit board through the first and second electrode pads of the circuit board,
    wherein
    the second substrate is disposed between the first substrate and the circuit board.

19. The board of claim 18, wherein the third and fourth connection electrodes are connected to the first and second electrode pads, respectively.

* * * * *